(12) United States Patent
Furuta (10) Patent No.: US 11,626,861 B2
(45) Date of Patent: Apr. 11, 2023

(54) RING OSCILLATOR AND METHOD FOR STARTING RING OSCILLATOR

(71) Applicant: LAPIS TECHNOLOGY CO., LTD., Kanagawa (JP)

(72) Inventor: Manabu Furuta, Kanagawa (JP)

(73) Assignee: LAPIS TECHNOLOGY CO., LTD., Yokohama (JP)

( * ) Notice: Subject to any disclaimer, the term of this patent is extended or adjusted under 35 U.S.C. 154(b) by 0 days.

(21) Appl. No.: 17/702,470

(22) Filed: Mar. 23, 2022

(65) Prior Publication Data

US 2022/0321107 A1 Oct. 6, 2022

(30) Foreign Application Priority Data

Mar. 30, 2021 (JP) .............................. JP2021-058176

(51) Int. Cl.
| | | |
|---|---|---|
| *H03K 3/014* | (2006.01) | |
| *H03K 3/03* | (2006.01) | |
| *H03L 3/00* | (2006.01) | |
| *H03L 7/099* | (2006.01) | |

(52) U.S. Cl.
CPC ............ *H03K 3/014* (2013.01); *H03K 3/0315* (2013.01); *H03L 3/00* (2013.01); *H03L 7/0995* (2013.01); *H03B 2200/0094* (2013.01)

(58) Field of Classification Search
CPC .. H03B 5/06; H03B 2200/0094; H03K 3/014; H03K 3/0315; H03K 3/0322; H03L 3/00
USPC .......................................................... 331/57
See application file for complete search history.

(56) References Cited

U.S. PATENT DOCUMENTS

| | | | | | |
|---|---|---|---|---|---|
| 6,104,256 | A | * | 8/2000 | Boudewijns ......... | H03K 3/0315 331/34 |
| 6,163,224 | A | * | 12/2000 | Araki ..................... | H03K 3/03 331/34 |
| 7,449,965 | B2 | * | 11/2008 | Jang ...................... | G11C 11/406 331/186 |
| 8,604,885 | B2 | * | 12/2013 | Kouyama ............. | H03L 7/0995 331/185 |
| 10,917,076 | B1 | * | 2/2021 | Kalyanamahadevi Gopalan Jawarlal ............... | H03K 3/0315 |

(Continued)

FOREIGN PATENT DOCUMENTS

| | | |
|---|---|---|
| JP | 2014045359 A | 3/2014 |
| JP | 2016039530 A | 3/2016 |

*Primary Examiner* — Levi Gannon
(74) *Attorney, Agent, or Firm* — Volentine, Whitt & Francos, PLLC (57) ABSTRACT

A ring oscillator including: an oscillation circuit including an even number of inverters connected in a ring configuration, the oscillation circuit outputting a clock signal; plural potential fixing circuits respectively connected between pairs of the inverters, each of plural potential fixing circuits being switchable between a connected and a disconnected state in response to a first control signal; and an adjustment circuit that adjusts a drive capability of the inverters based on a second control signal, wherein, during startup, the drive capability is controlled to be a first capability, in which the potential fixing circuits are connected, by the first control signal, and wherein, after a predetermined time has elapsed after the first control signal is output, the drive capability is controlled to be a second capability, higher than the first capability, in which the potential fixing circuits are disconnected, by the second control signal.

8 Claims, 6 Drawing Sheets

(56) References Cited

U.S. PATENT DOCUMENTS

| | | | |
|---|---|---|---|
| 11,115,005 B2* | 9/2021 | Liu | H03L 7/1974 |
| 2005/0063231 A1* | 3/2005 | Matsue | H03K 3/0315 |
| | | | 365/202 |
| 2008/0111639 A1* | 5/2008 | Ryckaert | H03K 3/0322 |
| | | | 455/255 |
| 2009/0072914 A1* | 3/2009 | Murata | H03K 5/1534 |
| | | | 327/109 |
| 2014/0055204 A1 | 2/2014 | Maruko et al. | |
| 2018/0091094 A1* | 3/2018 | La Rosa | G05F 3/262 |

* cited by examiner

RING OSCILLATOR AND METHOD FOR STARTING RING OSCILLATOR

CROSS-REFERENCE TO RELATED APPLICATION

This application claims priority under 35 USC 119 from Japanese Patent Application No. 2021-058176, filed on Mar. 30, 2021, the disclosure of which is incorporated by reference herein.

BACKGROUND

Technical Field

The present disclosure relates to a ring oscillator and a method for starting a ring oscillator.

Related Art

A ring oscillator is an oscillation circuit having a configuration where plural delay elements are connected in a ring configuration, and typically inverters (NOT circuits) are used as the delay elements. The number of stages of inverters is usually an odd number, but ring oscillators having an even number of stages of inverters (hereinafter sometimes called "even-stage ring oscillators") are also known. A ring oscillator can output not only a single-phase clock signal but also clock signals with multiple phases (multiple-phase clock signals) in accordance with the number of stages of inverters. A ring oscillator that outputs multiple-phase clock signals is used in circuits needing clocks with plural phases, such as a clock data recovery (CDR) circuit or a serializer/deserializer (SerDes) circuit. Depending on the specifications of the data employed by a CDR circuit or a SerDes circuit, serial data needs to be expanded to parallel data of an even-number system. In order create parallel data of an even-number system, clock signals with an even number of phases are needed, and in order to generate clock signals with an even number of phases, using a ring oscillator with an even number of stages is preferred for reasons such as homogeneity in delay time.

As a document that discloses technology relating to an even-stage ring oscillator, for example, Japanese Patent Application Laid-open (JP-A) No. 2014-045359 is known. The differential ring oscillation circuit disclosed in JP-A No. 2014-045359 extracts, from a differential ring oscillation unit in which delay circuits that delay and output biphase signals are connected in an even number of stages in a ring configuration, biphase input signals to one delay circuit of an even-number stage and biphase input signals to one delay circuit of an odd-number stage. Then, in a case in which the biphase input signals to the one delay circuit of the even-number stage are at a predetermined same level, either one of biphase output signals from the delay circuit that delays those biphase input signals is forcibly made to become a specific potential. Furthermore, in a case in which it is detected that the biphase input signals to the one delay circuit of the odd-number stage are at a predetermined same level, either one of biphase output signals from the delay circuit that delays those biphase input signals is forcibly made to become a specific potential. In the differential ring oscillation circuit according to JP-A No. 2014-045359, detection of the same phase level state is performed in each of the delay circuits of the even-number stages and the delay circuits of the odd-number stages. Accordingly, the differential ring oscillation unit starts up in a normal oscillation state no matter what the same phase level state is. For this reason, according to this disclosure, the differential ring oscillation circuit is effectively kept from becoming deadlocked.

Furthermore, JP-A No. 2016-039530 is also known. The CDR circuit disclosed in JP-A No. 2016-039530 includes an even-phase ring oscillator. The even-phase ring oscillator has, among delay circuits connected in a ring configuration, a delay circuit that outputs plural data retention clocks. Selects one delay circuit that will not cause a sudden circuit operation leading to a malfunction based on an oscillation output signal of an even phase, and synchronizes, with a data change, only the delay time measurement start timing until that delay circuit outputs the data retention clocks, thereby preventing a malfunction of the circuit. In JP-A No. 2016-039530, because the CDR circuit has the even-phase ring oscillator with this configuration, normal data can be retained without a malfunction of the CDR circuit, even in a case where the frequency offset of reference frequency signal sources on the data transmission side and receiving side is large.

Here, because an even-stage ring oscillator is configured by series-connecting an even number of inverters in a ring configuration as described above, it has the characteristic that it becomes logically stable and unable to oscillate, if it cannot be started appropriately. For that reason, special considerations are needed to reliably start an even-stage ring oscillator. For example, conventionally, methods that connect pull-up circuits or pull-down circuits between the inverters configuring an even-stage ring oscillator are known.

In the conventional even-stage ring oscillator, the potential of the inputs/outputs is fixed so that some of the circuits of the inverters have stress by, for example, setting the input/output of at least one of the inverters configuring the even-stage ring oscillator both to a low level (hereinafter, written as "L"; conversely, a high level will be written as "H") during initial startup. In this method, the ring oscillator is made to start oscillating utilizing the energy of a sudden transition from a state in which there is stress to a state in which there is no stress as a result of canceling the pull-ups or pull-downs from this fixed potential state.

However, even with the conventional ring oscillator, the above method has been insufficient to stably start the ring oscillator. That is, canceling the pull-ups or pull-downs does not lead to starting the ring oscillator with a reliability sufficient enough to be practical. It is believed that this is due to the relationship between the capability of the inverter circuits and the capability of the pull-up circuits or pull-down circuits during the energy transition accompanying the connection and disconnection of the pull-up circuits or pull-down circuits not being sufficiently considered. In this respect, startup is handled even in JP-A No. 2014-045359, but the differential ring oscillation circuit according to JP-A No. 2014-045359 tries to reliably oscillate by waiting for the output from a prior stage inverter and sending it to the next stage inverter, and its solution basically differs from that of this disclosure. Furthermore, JP-A No. 2016-039530 is to avoid a malfunction of the CDR circuit caused by a reference frequency offset between transmission and reception, and is not aimed to improve starting of the ring oscillator.

SUMMARY

The present disclosure provides a ring oscillator and a method for starting a ring oscillator that uses an even number of stages of inverters and that may be more reliably started.

A first aspect of the disclosure is a ring oscillator including:

an oscillation circuit including an even number of inverters connected in a ring configuration, the oscillation circuit outputting a clock signal; plural potential fixing circuits respectively connected between pairs of the inverters, each of the plural potential fixing circuits being switchable between a connected state and a disconnected state in response to a first control signal; and an adjustment circuit that adjusts a drive capability of the inverters based on a second control signal, wherein, during startup of the oscillation circuit, the drive capability is controlled to be a first capability, in which the potential fixing circuits are connected, by the first control signal, and wherein, after a predetermined time has elapsed after the first control signal is output, the drive capability is controlled to be a second capability, higher than the first capability, in which the potential fixing circuits are disconnected, by the second control signal.

Another aspect of the disclosure is a method for starting a ring oscillator including: an oscillation circuit including an even number of inverters connected in a ring configuration and outputting a clock signal, plural potential fixing circuits that are respectively connected between pairs of the inverters and are each switchable between being connected and being disconnected by a first control signal, and an adjustment circuit that adjusts the drive capability of the inverters based on a second control signal, the method including: during startup of the oscillation circuit, controlling a drive capability to become a first capability, in which the potential fixing circuits are connected, by the first control signal; and after a predetermined time has elapsed after the first control signal is output, controlling the drive capability to become a second capability, higher than the first capability, in which the potential fixing circuits are disconnected, by the second control signal.

According to the above aspects, the ring oscillator and the method for starting the ring oscillator of the present disclosure that uses an even number of inverter stages may be more reliably started.

BRIEF DESCRIPTION OF THE DRAWINGS

Exemplary embodiments will be described in detail based on the following figures, wherein.

DETAILED DESCRIPTION

Exemplary embodiments of the present disclosure will now be described in detail below with reference to the drawings. Each of the ring oscillators described below is mounted in a circuit that uses a clock signal, such as a CDR circuit or a SerDes circuit. However, in the following description mainly the ring oscillators are described. It will be noted that, in the following description, the circuit in which the ring oscillators according to the exemplary embodiments are mounted is called "the mounting circuit."

First Exemplary Embodiment

Figure 1A:
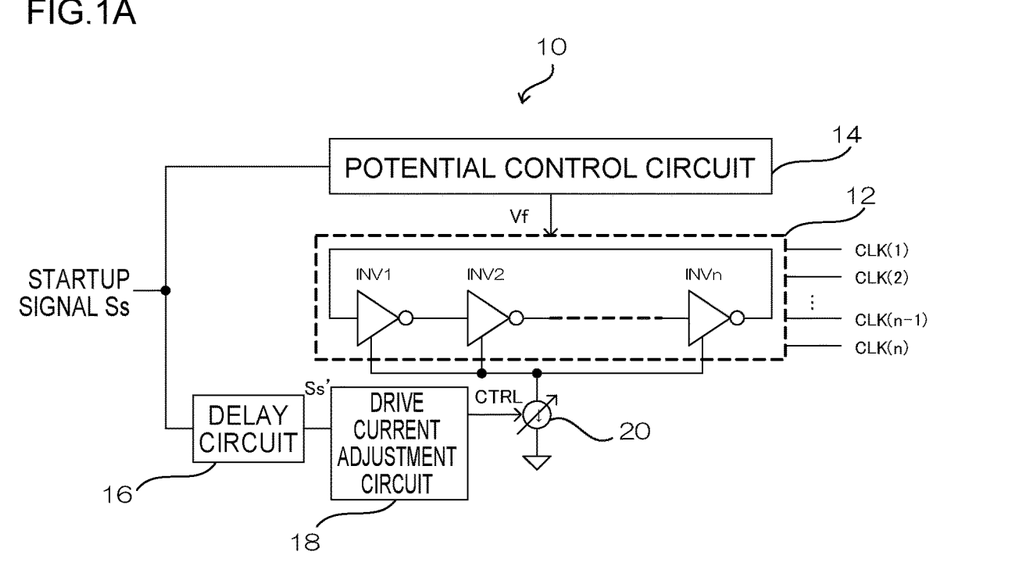
FIG. 1A is a block diagram illustrating the configuration of the ring oscillator according to a first exemplary embodiment.

A ring oscillator and a method for starting a ring oscillator according to a first exemplary embodiment will now be described with reference to FIG. 1A to FIG. 3. As illustrated in FIG. 1A, a ring oscillator 10 according to the present exemplary embodiment includes an oscillation circuit 12, a potential control circuit 14, a delay circuit 16, a drive current adjustment circuit 18, and a variable current source 20, and is started by a startup signal Ss. The startup signal Ss is, as an example, issued in a case in which a circuit that detects the switching-on of power provided in the mounting circuit has detected that power has been switched on. However, the issuance of the startup signal Ss is not limited to a circuit that detects the switching-on of power, and a control unit (e.g., a microcomputer) provided in the mounting circuit may also issue the startup signal Ss in a case in which it detects that a supply voltage has reached a prescribed voltage. Furthermore, the ring oscillator 10 according to the present exemplary embodiment outputs n-number of multiple-phase clock signals CLK(1), CLK(2), . . . , CLK(n−1), CLK(n). However, the number of clock signals that the ring oscillator 10 outputs does not need to be n-number, and an arbitrary number from 1 to (n−1) can also be selected. It will be noted that the "startup signal Ss" and the "drive current adjustment circuit 18" are examples of a "first control signal" and an "adjustment circuit," respectively, according to the present disclosure.

Figure 1B:
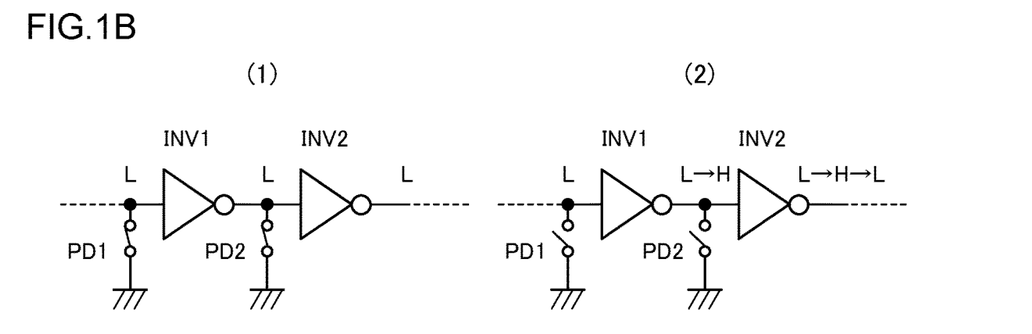
FIG. 1B is a circuit diagram for describing pull-down circuits of the ring oscillator according to the first exemplary embodiment.

The oscillation circuit 12 is an oscillation circuit in which n stages (where n is an arbitrary even number) of inverters INV1, INV2, . . . , INVn (hereinafter "the inverters INV" in a case in which referring to them collectively) are connected in series and in a ring configuration. The oscillation circuit 12 includes potential fixing circuits described later. The potential fixing circuits are circuits that forcibly fix the inputs/outputs of the inverters INV to a fixed level. As the potential fixing circuits, pull-up circuits PU are used in a case in which fixing the inputs/outputs to H, and pull-down circuits PD are used in a case in which fixing the inputs/outputs to L. In the present exemplary embodiment, as the potential fixing circuits, as illustrated in FIG. 1B, pull-down circuits PD (in FIG. 1B, pull-down circuits PD1, PD2 are illustrated as an example) are connected. Below, a configuration employing pull-down circuits PD as the potential fixing circuits will be described as an example. It will be noted that in the following description a configuration where pull-ups or pull-downs are connected to a power source or ground is described as an example, but because of the effects of parasitic elements of the pull-up circuits PU or pull-down circuits PD, the potential to be pulled up or pulled down is not invariably limited exactly to a power source or ground potential.

The potential control circuit 14 is a circuit that generates a potential fixing control signal Vf that controls the connection and disconnection of the potential fixing circuits connected between the stages of inverters configuring the oscillation circuit 12.

The delay circuit 16 is a circuit that delays the startup signal Ss a predetermined amount of time and outputs a startup signal Ss'. The variable current source 20 is a circuit that varies the current flowing to each of the inverters INV. The drive current adjustment circuit 18 is a circuit that outputs a current source control signal CTRL that controls the variable current source 20 based on the startup signal Ss'. It will be noted that the "startup signal Ss" is an example of a "second control signal" according to the present disclosure.

Next, the operation of the ring oscillator 10 will be described. In an initial state such as in a case in which power is switched on, the pull-down circuits PD are connected. When the startup signal Ss is issued, first the pull-down circuits PD are disconnected. As described above, the oscillation circuit 12 begins to start up by means of the energy accompanying the state transition from the connection to the disconnection of the pull-down circuits PD. The connection and disconnection of the pull-down circuits PD will be more specifically described with reference to FIG. 1B. In FIG. 1B, the pull-down circuits PD are represented equivalently by switches. As illustrated in (1) of FIG. 1B, in an initial state of the mounting circuit, the inputs/outputs of each of the inverters INV (in (1) of FIG. 1B, inverters INV1, INV2 are illustrated) are forcibly fixed to L by the pull-down circuits PD (in (1) of FIG. 1B, pull-down circuits PD1, PD2 are illustrated).

Next, as illustrated in (2) of FIG. 1B, in a case in which the pull-down circuits PD are disconnected, the effect of the pull-down circuits PD ceases, so the outputs of the inverters INV naturally change from L to H. That is, the balance in the inverters INV is disrupted, and in a case in which the input to inverter INV1 is L, the output from inverter INV1 (that is, the input to inverter INV2) changes from L to H. As a result of the input changing from L to H, the output from inverter INV2 that was initially L changes from L to H. This change occurs in at least one of the inverters INV, and in a case in which it completes one cycle, the oscillation circuit 12 starts oscillating.

Next, the startup signal Ss', which is the startup signal Ss that has been delayed by the delay circuit 16, is input to the drive current adjustment circuit 18. The drive current adjustment circuit 18 generates the current source control signal CTRL that controls the current of the variable current source 20 based on the startup signal Ss'. The current flowing to each of the inverters INV configuring the oscillation circuit 12 is adjusted by the current source control signal CTRL, and thus the oscillation circuit 12 oscillates more reliably.

Here, in the ring oscillator according to the comparative example described above, just the connection and disconnection of the potential fixing circuits is performed using the startup signal Ss, and the current flowing to the inverters INV is not adjusted. In the ring oscillator according to the comparative example also, the energy during the state transfer resulting from connecting and disconnecting the pull-down circuits PD is utilized to oscillate the ring oscillator. However, in the ring oscillator according to the comparative example, the relationship between the drive capability of the inverters INV during the connection and disconnection of the pull-down circuits PD and the drive capability of the pull-down circuits PD is not considered, so oscillation is not always stably started.

Figure 1C:
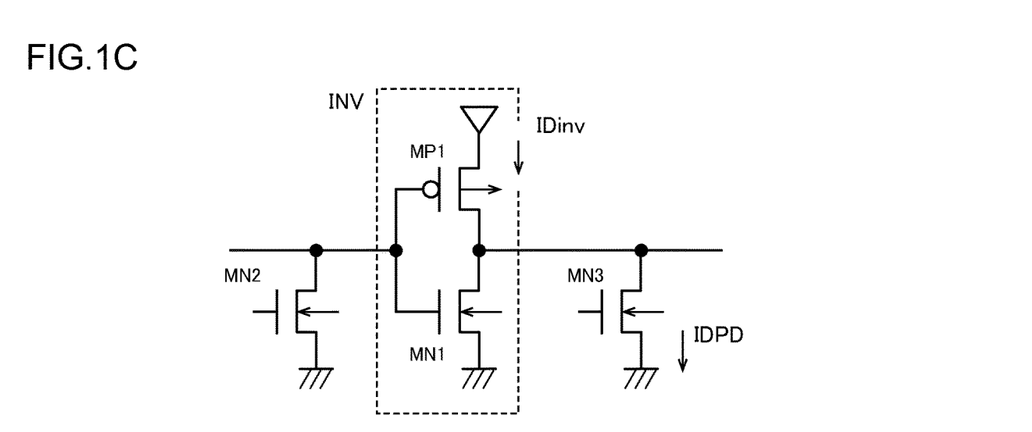
FIG. 1C is a drawing for describing the drive capability of inverters and the drive capability of the pull-down circuits during startup of the ring oscillator according to the first exemplary embodiment.

With reference to FIG. 1C, the relationship between the drive capability of the inverters INV during the connection and disconnection of the pull-down circuits PD and the drive capability of the pull-down circuits PD will be described. FIG. 1C is a diagram in which an inverter INV and pull-down circuits PD are represented by transistors. As illustrated in FIG. 1C, the inverter INV includes a P-type metal oxide semiconductor (MOS) transistor (hereinafter, "P-type transistor") MP1 and an N-type MOS transistor (hereinafter, "N-type transistor") MN1. The pull-down circuits PD are configured by N-type transistors MN2, MN3. The potential fixing control signal Vf illustrated in FIG. 1A is input to the gates of the N-type transistors MN2, MN3. The inverters INV are circuits that operate in such a way that their output becomes H in a case in which their input is L. Consequently, as illustrated in (1) of FIG. 1B, in a case in which the inputs/outputs of the inverters INV are forcibly fixed to L, the state of the inverters INV becomes unnatural and the P-type transistor MP1 and the N-type transistor MN3 try to mutually operate and enter a state of competition (a tug-of-war). It will be noted that in the case of employing pull-up circuits PU instead of the pull-down circuits PD, the N-type transistors MN2, MN3 illustrated in FIG. 1C are changed to P-type transistors and the P-type transistors are connected between the inputs/outputs of the inverters INV and a power source on the high potential side.

In order to eliminate this state of competition and reliably fix the inputs/outputs of the inverters INV to L in an initial state, the relationship between current IDinv flowing to the P-type transistor MP1 and current IDPD flowing to the N-type transistor MN3 needs to be IDinv<IDPD, that is, the drive capability of the N-type transistor MN3 configuring the pull-down circuit PD needs to be relatively greater than the drive capability of the P-type transistor MP1 configuring the inverter INV. In order for the N-type transistor MN3 and the P-type transistor MP1 to satisfy the above relationship, the following methods are conceivable.

Method 1: Relatively reduce the drive capability of the inverters INV during startup.

Method 2: Relatively increase the drive capability of the pull-down circuits PD.

If Method 2 is employed, it is necessary to increase the transistor size of the pull-down circuits PD (the N-type transistors MN2, MN3). However, in this case, the pull-down circuits PD with the relatively large transistor size become constantly connected even during normal operation after the oscillation circuit 12 has started oscillating. That is, a relatively large load capacity is constantly connected between the stages of the inverters INV even in a case in which the N-type transistors MN2, MN3 switch off. This does not become effective in a ring oscillator 10 whose oscillation frequency is relatively low, but it is disadvantageous in a case in which one wishes to speed up the oscillation frequency of the ring oscillator 10.

Thus, in the present exemplary embodiment, Method 1 is employed to switch the drive capability of the inverters INV between during startup of the ring oscillator 10 and during normal operation after the ring oscillator 10 has started oscillating. That is, during startup, the drive capability of the inverters INV is lowered so that the drive capability of the pull-down circuits PD is higher than the drive capability of the inverters INV, and during normal operation, the drive capability is raised so that a stable oscillation output is obtained. In the present exemplary embodiment, this configuration is realized by using the variable current source 20 to change the current flowing to the inverters INV. More specifically, during startup, the current flowing to the inverters INV is set to a relatively small current (hereinafter, sometimes called "the startup current"), and after the elapse of a predetermined amount of time after startup, the current flowing to the inverters INV is set to a relatively large current.

Figure 2A:
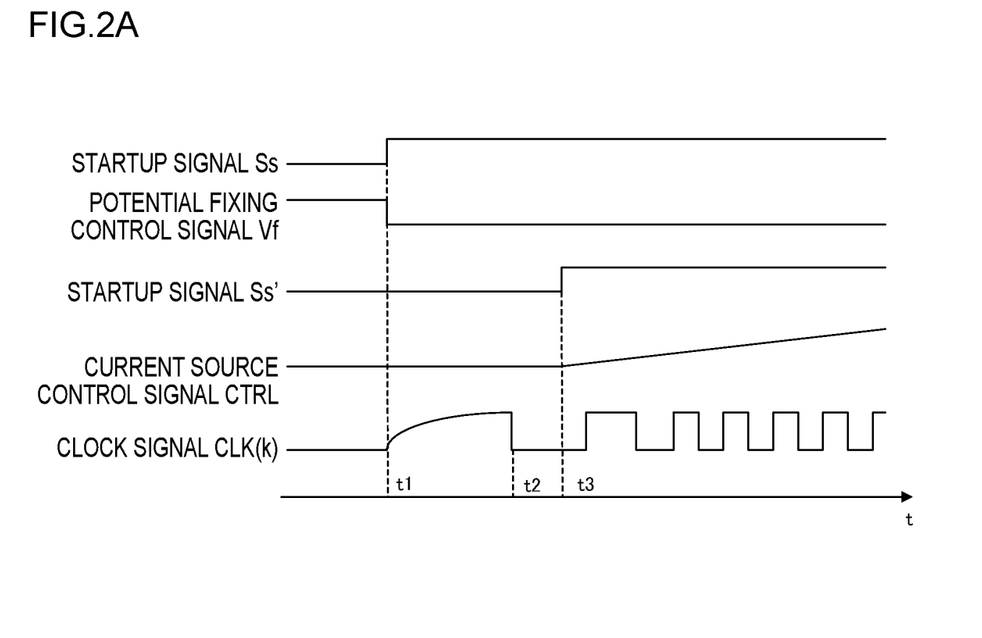
FIG. 2A is a time chart illustrating waveforms at each part during startup of the ring oscillator according to the first exemplary embodiment.
Figure 3:
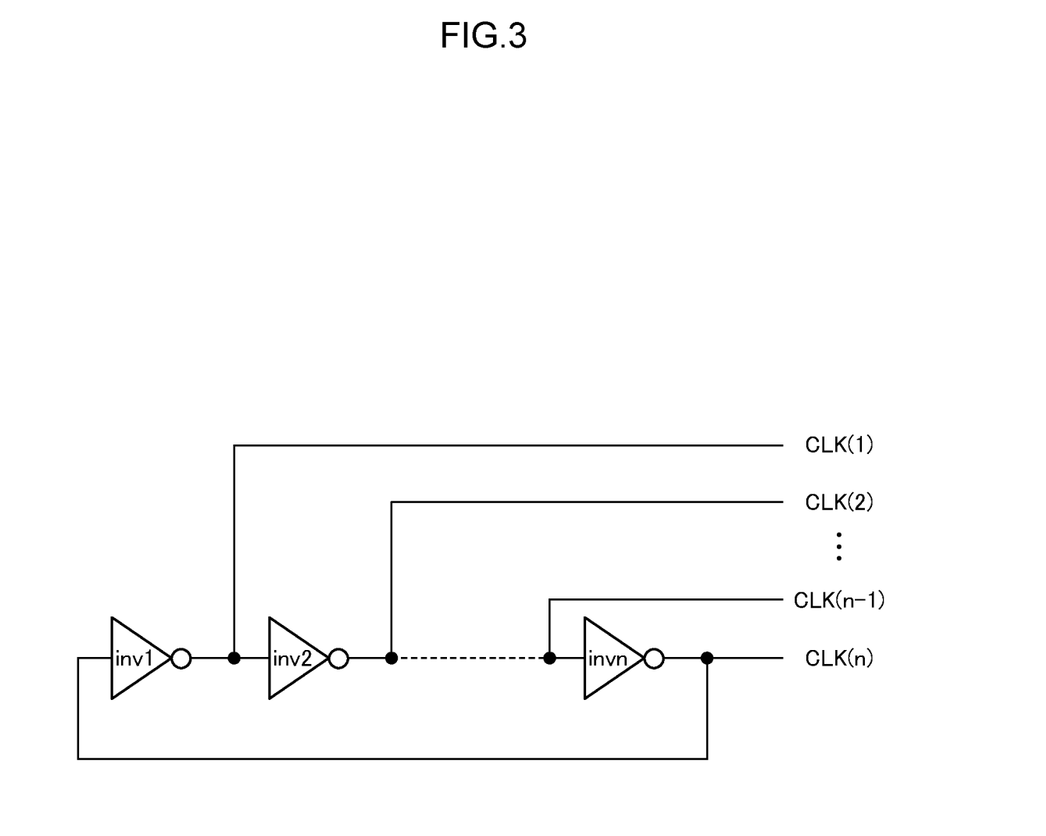
FIG. 3 is a circuit diagram describing the generation of multiple-phase clock signals by the ring oscillator according to the first exemplary embodiment.

Next, with reference to FIG. 2, changes in waveforms at each part of the ring oscillator 10 will be described. FIG. 2A illustrates, as waveforms at each part of the ring oscillator 10, the startup signals Ss, Ss', the potential fixing control signal Vf, the current source control signal CTRL, and the clock CLK(k) (where k is an arbitrary integer from 1 to n). As described above, the ring oscillator 10 according to the present exemplary embodiment outputs multiple-phase clock signals comprising n-number of clock signals. FIG. 3 illustrates the way in which the multiple-phase clock signals are extracted in the ring oscillator 10. As illustrated in FIG. 3, the multiple-phase clock signals are sequentially output from the outputs of each of the inverters INV, so that a clock signal CLK(1) is output from inverter INV1, a clock signal CLK(2) is output from inverter INV2, . . . , a clock signal CLK(n−1) is output from inverter INV(n−1), and a clock signal CLK(n) is output from inverter INVn.

As illustrated in FIG. 2A, the startup signal Ss is issued at time t1. The startup signal Ss is inactive at L and active at H (active H). Together with the issuance of the startup signal Ss, the potential fixing control signal Vf switches from H to L. The potential fixing control signal Vf, as described above, is input to the gates of the N-type transistors configuring the pull-down circuits PD. That is, the potential control circuit 14 according to the present exemplary embodiment has the function of converting the startup signal Ss to a signal with a polarity capable of driving the N-type transistors configuring the pull-down circuits PD and distributing it to the N-type transistors. Consequently, in a case where the potential fixing circuits are pull-up circuits PU, the potential fixing control signal Vf switches from L to H. It will be noted that, although in the present exemplary embodiment an active H startup signal Ss is described as an example, the startup signal Ss is not limited to this and may also be an active L.

The pull-down circuits PD are disconnected at time t1, whereby the nodes of the oscillation circuit 12 start undergoing a state transition and the oscillation circuit 12 starts oscillating. When the oscillation circuit 12 starts oscillating, the clock signal CLK(k) changes as illustrated in FIG. 2A as an example. At this time, a startup current that is a relatively small current flows to the inverters INV. The startup current flows to the drive current adjustment circuit 18 at time t1, so the current flowing the inverters INV remains the startup current for a predetermined amount of time, that is, until the delay time of the delay circuit 16 elapses.

At time t3, in a case in which the startup signal Ss', which is the startup signal Ss that has been delayed by the delay circuit 16, is input to the drive current adjustment circuit 18, the current source control signal CTRL transitions from a startup state to a normal operating state and the ring oscillator 10 begins to start up. Because of the current source control signal CTRL, the oscillation circuit 12 transitions from a startup state to a normal operating state. When the current source control signal CTRL increases, the current in the inverters INV configuring the oscillation circuit 12 increases, so the oscillation frequency of the oscillation circuit 12 becomes higher. In the present exemplary embodiment, the arrival point of the current source control signal CTRL is set so that the oscillation frequency of the clock signal CLK(k) becomes a desired oscillation frequency. Namely, the ring oscillator 10 operates as a voltage controlled oscillator (VCO) that uses the current source control signal CTRL as a frequency control voltage. It will be noted that the ring oscillator 10 can be configured not only as a simple clock source but also as a phase locked loop (PLL). That is, the drive current adjustment circuit 18 may be provided with a phase comparison circuit that compares the phases of a reference clock signal and the clock signal CLK(k), and the drive current adjustment circuit 18 may use the output of the phase comparison circuit to generate the current source control signal CTRL.

Figure 2B:
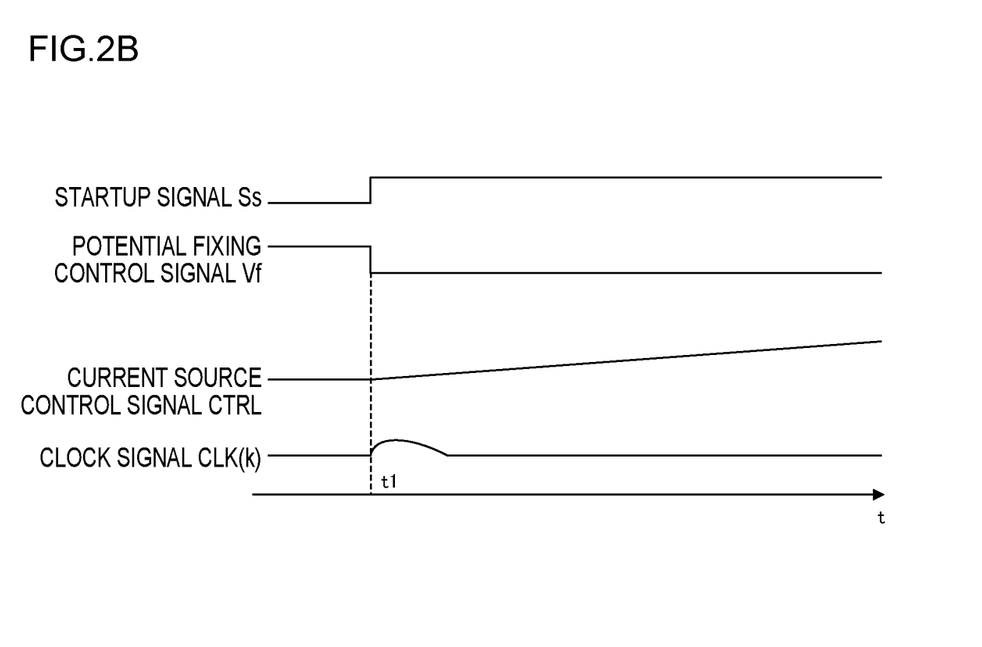
FIG. 2B is a time chart illustrating waveforms at each part during startup of a ring oscillator according to a comparative example.

With reference to FIG. 2B, the reason for providing the delay circuit 16 in the ring oscillator 10 will be described. In the ring oscillator 10, the drive capability of the inverters INV differs between during startup and during normal operation, so the system tries to move to the normal operating state without delay after the startup of the inverters INV. However, if the move to the normal operation ends up preceding the startup operation due to circuit operating conditions, the ring oscillator 10 starts in a state in which the capability of the inverters INV is high, and it is anticipated that the pull-down circuits PD will be unable to be fixed at an appropriate potential and the oscillation circuit 12 will become unable to oscillate. That is, if the startup signal Ss' is issued at a timing before the oscillation operation of the oscillation circuit 12 completes one cycle after the startup of the ring oscillator, a malfunction where oscillation is not started is also anticipated.

Namely, if the ring oscillator 10 is not provided with the delay circuit 16, as illustrated in FIG. 2B, the current source control signal CTRL starts changing at the same time that the startup signal Ss and the potential fixing control signal Vf invert at time t1. At this point in time the oscillation circuit 12 starts oscillating, but at the same time the drive capability of the inverters INV continues to become higher. Namely, the current source control signal CTRL starts transitioning at the same time that the startup signal Ss inverts, so there is the potential for the drive capability of the inverters INV to increase and end up fixing the logic state before the inverters INV undergo a state transition and that state transition propagates and leads to oscillation starting. As a result, as illustrated in FIG. 2B, the clock signal CLK(k) ends up stopping midway even though it has started oscillating.

In contrast, in the ring oscillator 10, the state transition of the oscillation circuit 12 completes one cycle at time t2 illustrated in FIG. 2A. That is, the delay time of the delay circuit 16 is set to be longer than the delay time of one cycle of the oscillation circuit 12. Namely, the current source control signal CTRL is configured to rise after, for example, the oscillation of the oscillation circuit 12 has become stable at time t2. Due thereto, the oscillation circuit 12 can start oscillating in a more reliable state. As for the difference between the delay time of one cycle of the oscillation circuit 12 and the delay time of the delay circuit 16 (i.e., the amount of time from time t2 to time t3), an appropriate value may be found beforehand by experiment or simulation, for example. Here, the delay time of the delay circuit 16 is basically set to the time it takes for the oscillation of the oscillation circuit 12 to become stable. Consequently, setting the delay time of the delay circuit 16 to be longer than the delay time of one cycle of the oscillation circuit 12 is an example.

As described in detail above, in the ring oscillator and the method for starting a ring oscillator according to the present exemplary embodiment, by delaying the start of the transition of the current source control signal CTRL, the ring oscillator 10 starts normal operation after sufficiently standing by after the inverters INV configuring the oscillation circuit 12 have undergone a state transition. Because of this, according to the ring oscillator and the method for starting a ring oscillator according to the present exemplary embodiment, there can be provided a ring oscillator using an even number of stages of inverters that may be more reliably started and a method for starting a ring oscillator. Furthermore, in the present exemplary embodiment, the drive current adjustment circuit 18 and the variable current source 20 that change the current flowing to the inverters INV double as a frequency adjustment circuit that changes the oscillation frequency of the ring oscillator 10, so an increase in circuit scale may also be inhibited.

Second Exemplary Embodiment

Figure 4A:
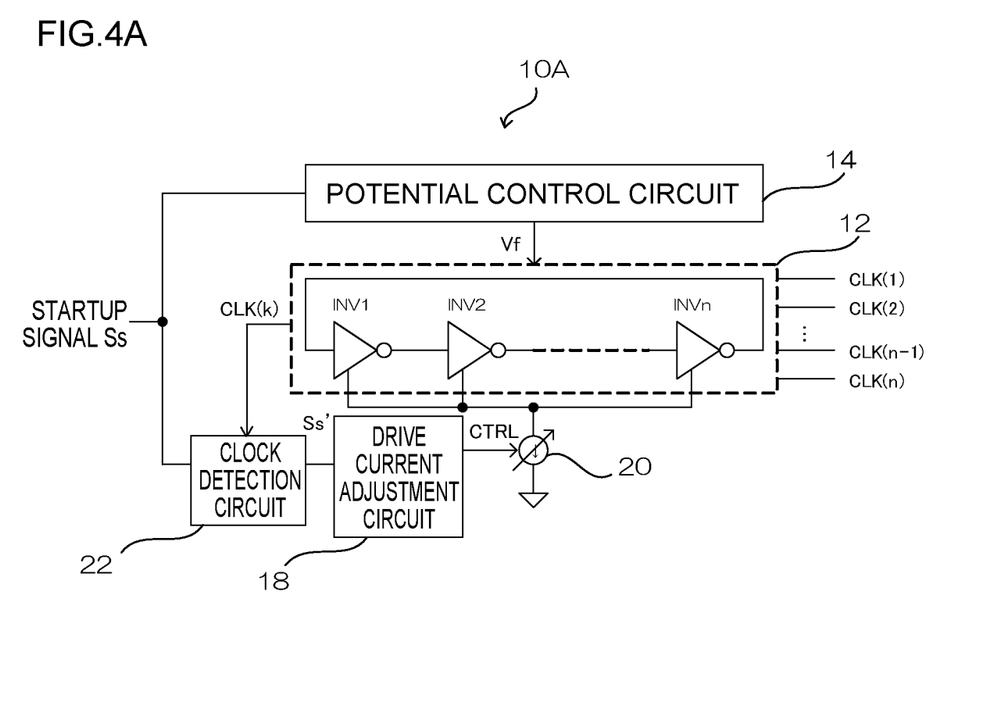
FIG. 4A is a block diagram illustrating the configuration of the ring oscillator according to a second exemplary embodiment.
Figure 4B:
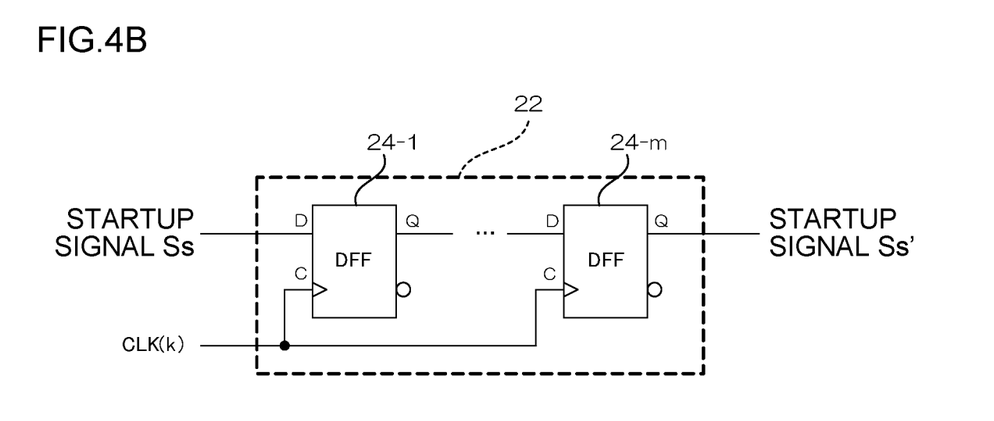
FIG. 4B is a circuit diagram illustrating the configuration of a clock detection circuit of the ring oscillator according to the second exemplary embodiment.
Figure 5:
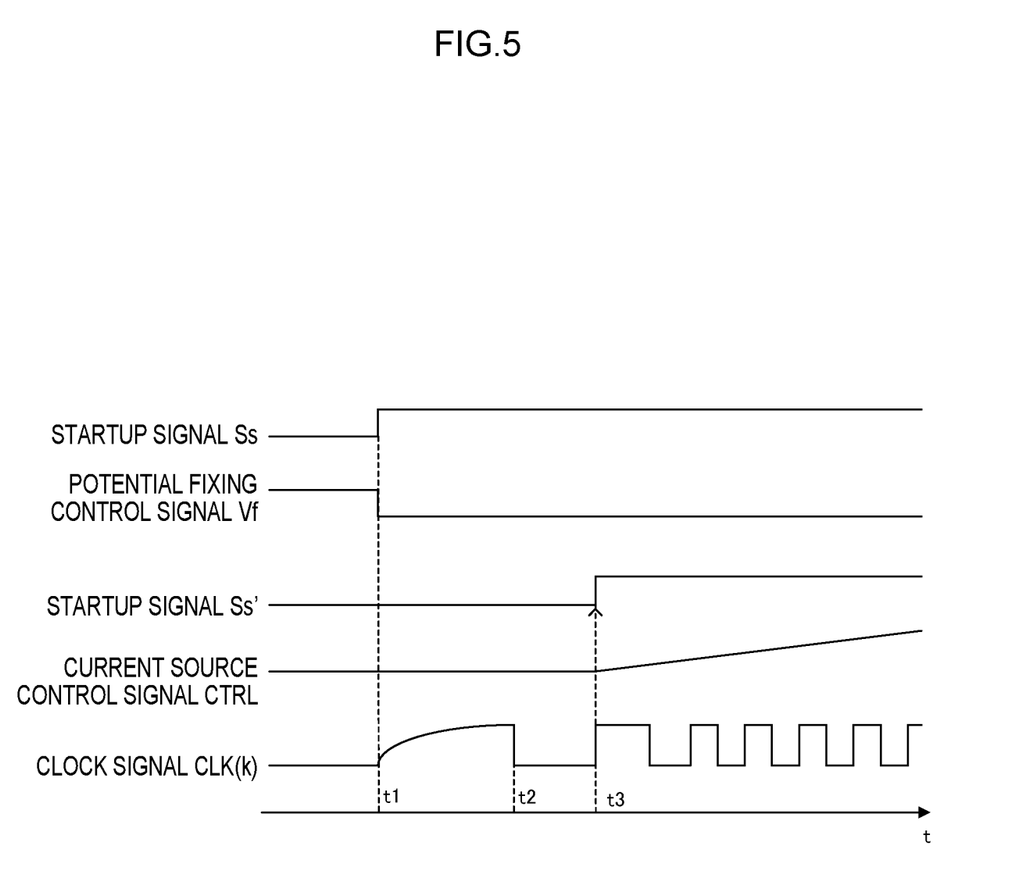
FIG. 5 is a time chart illustrating waveforms at each part during startup of the ring oscillator according to the second exemplary embodiment.

A ring oscillator and a method for starting a ring oscillator according to a second exemplary embodiment will now be described with reference to FIG. 4A, FIG. 4B and FIG. 5. As illustrated in FIG. 4A, a ring oscillator 10A according to the present exemplary embodiment has a configuration where the delay circuit 16 is replaced with a clock detection circuit 22 in the ring oscillator 10 according to the first exemplary embodiment. Consequently, configurations that are the same as those of the ring oscillator 10 are assigned the same reference signs and detailed description thereof will be omitted. It will be noted that the "clock detection circuit 22" is an example of a "detection circuit" according to the present disclosure.

The clock detection circuit 22 has one of the n-number of clock signals (for example, the clock signal CLK(k)) input to it, delays the startup signal Ss based on the clock signal CLK(k), and outputs the startup signal Ss'. FIG. 4B illustrates an example of the clock detection circuit 22. As illustrated in FIG. 4B, the clock detection circuit 22 is configured by plural (in FIG. 4B, m-number is illustrated as an example) DFFs 24-1, 24-2, . . . , 24-$m$ (hereinafter "the DFFs 24" in a case in which referring to them collectively) connected in series. The startup signal Ss is input to the D input of the first stage DFF 24-1, and the startup signal Ss' is output from the Q output of the last stage DFF 24-$m$. The Q outputs of the DFFs in the middle are connected to the D input of the next stage. The clock signal CLK(k) is input to the clock input C of each of the DFFs 24.

The clock detection circuit 22 starts monitoring the clock signal CLK(k) upon receiving the startup signal Ss. In the clock detection circuit 22, in a case in which the startup signal Ss has become H, the DFFs 24 shift that H signal. Then, in a case in which the clock detection circuit 22 detects pulses of the clock signal CLK(k) equal to the number of stages of the DFFs 24, it outputs the startup signal Ss' to the drive current adjustment circuit 18.

The operation of the ring oscillator 10A will now be described in greater detail with reference to FIG. 5. As illustrated in FIG. 5, in a case in which the startup signal Ss inverts at time t1, the potential fixing control signal Vf is output from the potential control circuit 14, the nodes of the oscillation circuit 12 start undergoing a state transition, and the oscillation circuit 12 starts oscillating. That is, as illustrated in FIG. 5, the clock signal CLK(k) starts changing. The above operation is the same as in the case of the ring oscillator 10 illustrated in FIG. 2A.

Monitoring of the clock signal CLK(k) by the clock detection circuit 22 is started at time t1, and in a case in which the clock detection circuit 22 detects the m-th pulse of the clock signal CLK(k) at time t3, the startup signal Ss' is output to the drive current adjustment circuit 18. The drive current adjustment circuit 18 receiving the startup signal Ss' outputs the current source control signal CTRL to start adjusting the current value of the variable current source 20, and the ring oscillator 10A moves from the startup state to the normal operating state. Operation from time t3 on is the same as in the case of the ring oscillator 10 illustrated in FIG. 2A. It will be noted that the number of stages m of the DFFs 24 in the clock detection circuit 22 may be determined in accordance with the delay time of the startup signal Ss' that is needed. Furthermore, the clock signal CLK(k) that is input to the clock detection circuit 22 may also be determined in accordance with the delay time of the startup signal Ss' that is needed.

As described above, according to the ring oscillator and the method for starting a ring oscillator according to the present exemplary embodiment, the clock detection circuit 22 detects the clock signal CLK(k) and then the drive current adjustment circuit 18 starts outputting the current source control signal CTRL, so the oscillation circuit 12 can start oscillating in a more stable state. As a result, the ring oscillator 10A can begin to start up more reliably. In the ring oscillator 10 according to the first exemplary embodiment, it is also anticipated that the reliability of the oscillation by the ring oscillator 10 will drop due to, for example, variations in the delay time of the delay circuit 16. However, in the ring oscillator 10A according to the present exemplary embodiment, right from the start, the clock detection circuit 22 detects the clock signal CLK(k) and then the drive current adjustment circuit 18 outputs the current source control signal CTRL, so the reliability of the oscillation of the ring oscillator 10A may be further improved.

Third Exemplary Embodiment

A ring oscillator and a method for starting a ring oscillator according to a third exemplary embodiment will now be described with reference to FIG. 6. A ring oscillator 10B according to the present exemplary embodiment has a configuration where the ring oscillator 10A according to the second exemplary embodiment is provided with a reset function. Consequently, configurations that are the same as those of the ring oscillator 10A are assigned the same reference signs and detailed description thereof will be omitted.

Figure 6A:
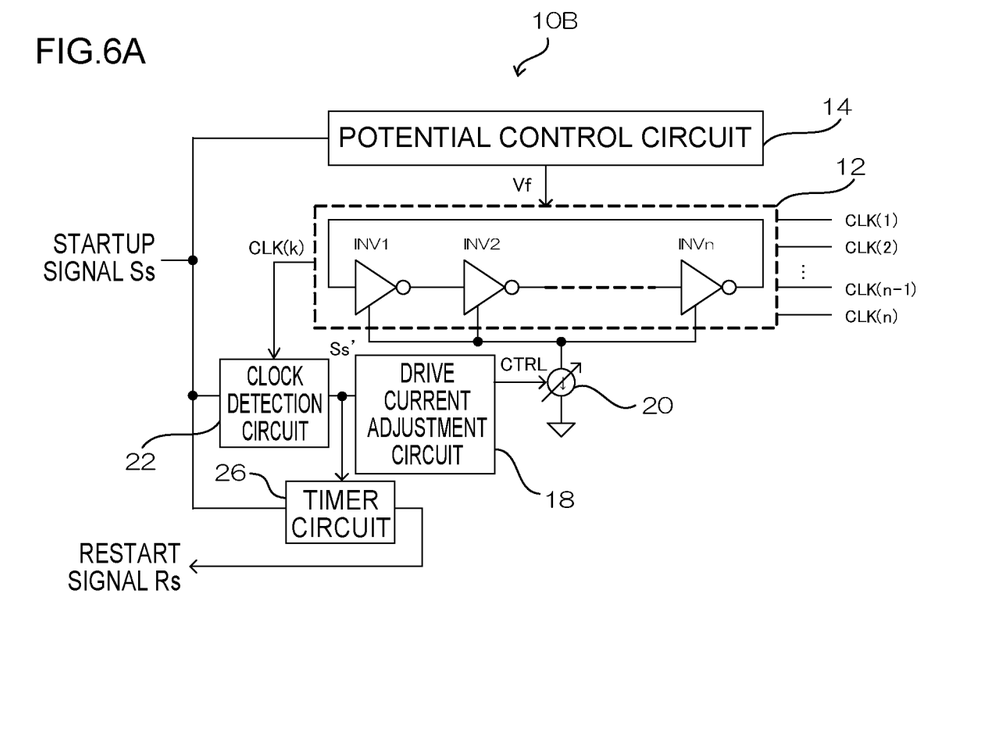
FIG. 6A is a block diagram illustrating an example of the configuration of the ring oscillator according to a third exemplary embodiment.
Figure 6B:
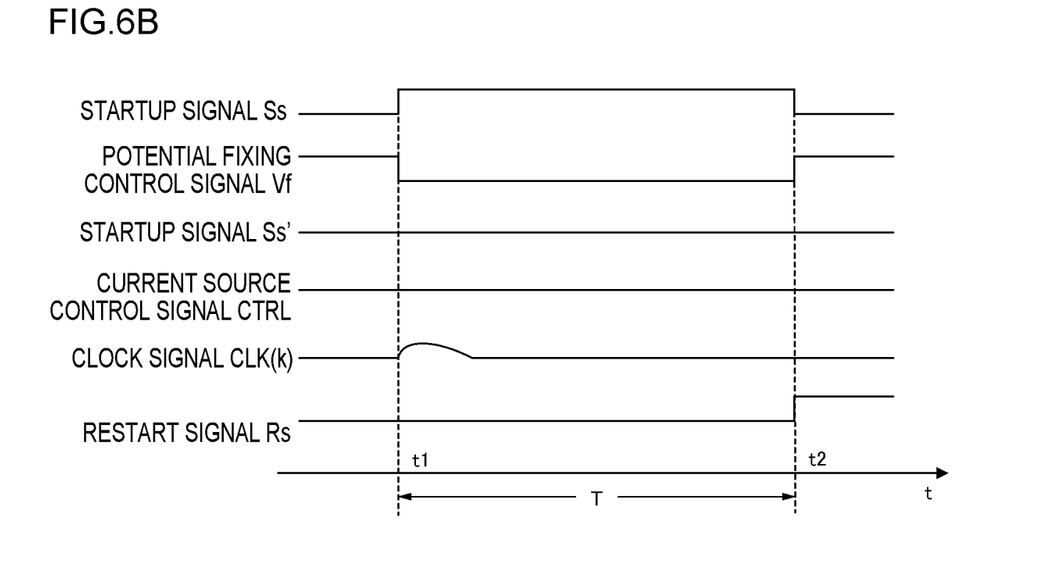
FIG. 6B is a time chart illustrating waveforms at each part during startup of the ring oscillator according to the third exemplary embodiment.

As illustrated in FIG. 6A, the ring oscillator 10B is configured by adding a timer circuit 26 to the ring oscillator 10A illustrated in FIG. 4A. The ring oscillator 10 according to the first exemplary embodiment or the ring oscillator 10A according to the second exemplary embodiment has no remedy for in a case in which the oscillation circuit 12 fails to start. Thus, the ring oscillator 10B according to the present exemplary embodiment is provided with the timer circuit 26, and in a case in which startup of the oscillation circuit 12 is unable to be confirmed by the time the count time of the timer circuit 26 expires (in a case in which time is up), the timer circuit 26 is configured to reset the ring oscillator 10B. It will be noted that the "timer circuit 26" is an example of a "counter circuit" according to the present disclosure.

The operation of the ring oscillator 10B will be described in greater detail with reference to FIG. 6B. As illustrated in FIG. 6B, the oscillation circuit 12 receives the startup signal Ss at time t1, the potential fixing control signal Vf inverts, the oscillation circuit 12 fails to start even though it has begun to start, and the state transition of the clock signal CLK(k) stops midway. Consequently, neither the startup signal Ss' nor the current source control signal CTRL issue. At this time, assuming that T denotes the count time of the timer circuit 26, the timer circuit 26 outputs a restart signal Rs at time t2 after the count time T has elapsed from time t1. The restart signal Rs is transmitted to a circuit (e.g., a power-on reset circuit or a control circuit) that issues the startup signal Ss, and that circuit resets the startup signal Ss and returns it from H to L. As a result of the startup signal Ss returning to L, the potential fixing control signal Vf also returns from L to H. From then on, the circuit that issues the startup signal Ss reissues the startup signal Ss to try to start the ring oscillator 10B. In a case where the ring oscillator 10B has been started normally, the timer circuit 26 is reset by the startup signal Ss', so the restart signal Rs is not issued.

As described above, according to the ring oscillator and the method for starting a ring oscillator according to the present exemplary embodiment, by equipping the ring oscillator with a function for recovering the ring oscillator in a case where the oscillation circuit 12 has failed to start, the reliability of the oscillation of the ring oscillator may be further improved. It will be noted that although in the present exemplary embodiment a configuration where the ring oscillator 10A according to the second exemplary embodiment is provided with a reset function was described as an example, the reset function is not limited to this, and the ring oscillator 10 according to the first exemplary embodiment may also be provided with a reset function. In this case, the clock detection circuit may be separately provided, and the startup signal Ss and the output of the clock signal detection circuit may be input to the timer circuit.

It will be noted that although in each of the above exemplary embodiments a configuration where the startup signal Ss' is generated from the startup signal Ss was described as an example, the startup signals are not limited to this and may also be generated from separate systems. In this case, for example, a control unit (e.g., a microcomputer) provided in the mounting circuit may be configured to issue the startup signal Ss and the startup signal Ss' with a time difference between them.

What is claimed is:

1. A ring oscillator comprising:
   an oscillation circuit including an even number of inverters connected in a ring configuration, the oscillation circuit outputting a clock signal;
   a plurality of potential fixing circuits respectively connected between pairs of the inverters, each of the plurality of potential fixing circuits being switchable between a connected state and a disconnected state in response to a first control signal; and
   an adjustment circuit that adjusts a drive capability of the inverters based on a second control signal,
   wherein, during startup of the oscillation circuit, the drive capability is controlled to be a first capability, in which the potential fixing circuits are connected, by the first control signal, and
   wherein, after a predetermined time has elapsed after the first control signal is output, the drive capability is controlled to be a second capability, higher than the first capability, in which the potential fixing circuits are disconnected, by the second control signal.

2. The ring oscillator according to claim 1, wherein the drive capability is adjusted by current flowing to the inverters, and current corresponding to the second capability is greater than current corresponding to the first capability.

3. The ring oscillator according to claim 1, wherein the predetermined time is longer than a delay time of one cycle of the inverters.

4. The ring oscillator according to claim 1, wherein the potential fixing circuits are pull-up circuits or pull-down circuits.

5. The ring oscillator according to claim 1, wherein the second control signal is a signal in which the first control signal is delayed by a delay circuit having a delay time corresponding to the predetermined time.

6. The ring oscillator according to claim 1, further comprising a detection circuit that detects the clock signal,
   wherein the second control signal is output from the detection circuit in a case in which the detection circuit has detected the clock signal.

7. The ring oscillator according to claim 1, further comprising a counter circuit that has a count time longer than the predetermined time,
   wherein a counting operation of the counter circuit is started by the first control signal and is stopped by the second control signal.

8. A method for starting a ring oscillator including: an oscillation circuit including an even number of inverters connected in a ring configuration and outputting a clock signal, a plurality of potential fixing circuits that are respectively connected between pairs of the inverters and are each switchable between being connected and being disconnected by a first control signal, and an adjustment circuit that adjusts the drive capability of the inverters based on a second control signal, the method comprising:
   during startup of the oscillation circuit, controlling a drive capability to become a first capability, in which the potential fixing circuits are connected, by the first control signal; and
   after a predetermined time has elapsed after the first control signal is output, controlling the drive capability to become a second capability, higher than the first capability, in which the potential fixing circuits are disconnected, by the second control signal.

* * * * *